US012768878B2

(12) United States Patent
Emberger et al.

(10) Patent No.: US 12,768,878 B2
(45) Date of Patent: Oct. 20, 2026

(54) DEVICE COOLING ENCLOSURE AND ADAPTER FOR HOUSING DEVICES OF DIFFERENT WIDTHS

(71) Applicant: MICRON TECHNOLOGY, INC., Boise, ID (US)

(72) Inventors: Brad Emberger, San Jose, CA (US); Justin Glasgow, San Jose, CA (US); Kapil Ayyawar, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 18/443,184

(22) Filed: Feb. 15, 2024

(65) Prior Publication Data

US 2024/0302430 A1 Sep. 12, 2024

Related U.S. Application Data

(60) Provisional application No. 63/466,621, filed on May 15, 2023, provisional application No. 63/531,792, filed on Aug. 9, 2023.

(51) Int. Cl.
*G01R 31/10* (2006.01)
*G01R 31/28* (2006.01)

(52) U.S. Cl.
CPC ..... *G01R 31/2849* (2013.01); *G01R 31/2862* (2013.01); *G01R 31/2877* (2013.01)

(58) Field of Classification Search
CPC ............ G01R 31/2849; G01R 31/2862; G01R 31/2877
See application file for complete search history.

(56) References Cited

U.S. PATENT DOCUMENTS

| | | | |
|---|---|---|---|
| 5,315,240 | A | 5/1994 | Jones |
| 6,064,571 | A | 5/2000 | Noble |

(Continued)

FOREIGN PATENT DOCUMENTS

| | | | |
|---|---|---|---|
| JP | 2006170923 | A | 6/2006 |
| JP | 3131595 | U | 5/2007 |

(Continued)

OTHER PUBLICATIONS

Author N/A; Thermal Management for Testing High-Power IC Device Source: https://www.electronicdesign.com/home/article/21200761/thermal-management-for-testing-highpower-ic-devices; Publication Date: May 1, 2003.

(Continued)

*Primary Examiner* — Thang X Le
(74) *Attorney, Agent, or Firm* — Lowenstein Sandler LLP

(57) ABSTRACT

Embodiments of the present invention provide a DUT air duct shroud that can receive and house DUTs of a specific form factor, and can advantageously be adapted to house and cool DUTs of a different (e.g., narrower) form factor. The DUT shrouds described herein guide the DUT into the correct position and orientation to be received by the test system for quick and convenient installation, and advantageously redirect the air flow to the narrower form factor for effective cooling during testing. The DUT shrouds can be used in conjunction with device interface boards and similar components used to test memory devices and computer hardware using active cooling systems, and embodiments are also operable to house and cool consumer memory devices of different form factors.

15 Claims, 17 Drawing Sheets

(56) References Cited

U.S. PATENT DOCUMENTS

| | | | | |
|---|---|---|---|---|
| 6,292,361 | B1 | 9/2001 | Johnson et al. | |
| 6,496,366 | B1 * | 12/2002 | Coglitore | G06F 1/20 361/679.48 |
| 6,974,335 | B1 | 12/2005 | Podpora | |
| 7,355,428 | B2 | 4/2008 | Kabbani et al. | |
| 8,116,075 | B2 | 2/2012 | Hall et al. | |
| 8,274,300 | B2 | 9/2012 | Sakaue et al. | |
| 8,766,656 | B2 | 7/2014 | Malik et al. | |
| 9,784,789 | B2 | 10/2017 | Kikuchi et al. | |
| 9,968,009 | B2 | 5/2018 | Chen et al. | |
| 10,670,650 | B2 | 6/2020 | Wolff | |
| 10,782,316 | B2 | 9/2020 | Tustaniwskyj | |
| 11,058,027 | B2 | 7/2021 | Artman et al. | |
| 11,099,228 | B2 | 8/2021 | Su | |
| 11,288,122 | B1 | 3/2022 | Fleisher et al. | |
| 12,411,167 | B2 * | 9/2025 | Cruzan | G01R 31/2834 |
| 2006/0164808 | A1 | 7/2006 | Stefanoski | |
| 2007/0236882 | A1 | 10/2007 | Chen | |
| 2008/0123292 | A1 | 5/2008 | Wobig et al. | |
| 2015/0355270 | A1 * | 12/2015 | Rogel-Favila | G01R 31/2874 324/750.08 |
| 2016/0088774 | A1 | 3/2016 | Alvarado et al. | |
| 2018/0259573 | A1 * | 9/2018 | Wolff | G01R 31/2877 |
| 2019/0094295 | A1 * | 3/2019 | Wolff | G01R 31/2874 |
| 2019/0285695 | A1 * | 9/2019 | Kim | G01R 31/2862 |
| 2020/0103283 | A1 * | 4/2020 | Tamal | G01J 3/501 |
| 2021/0127529 | A1 | 4/2021 | Hanna et al. | |
| 2021/0251101 | A1 | 8/2021 | Sheehan et al. | |
| 2021/0263073 | A1 * | 8/2021 | Stuart | G01R 1/06788 |
| 2021/0292083 | A1 | 9/2021 | Chiu et al. | |
| 2021/0302469 | A1 * | 9/2021 | Su | G01R 1/0416 |
| 2021/0302501 | A1 | 9/2021 | Su et al. | |
| 2021/0303430 | A1 | 9/2021 | Yuan et al. | |
| 2022/0058097 | A1 | 2/2022 | Bautista | |
| 2022/0102092 | A1 | 3/2022 | Piper | |
| 2022/0128625 | A1 * | 4/2022 | Akers | G01R 31/2875 |
| 2022/0137129 | A1 * | 5/2022 | Ranganathan | G01R 31/2865 324/756.02 |
| 2022/0148673 | A1 * | 5/2022 | Lai | G11C 29/46 |
| 2022/0155364 | A1 | 5/2022 | Kabbani et al. | |
| 2022/0206061 | A1 | 6/2022 | Ranganathan et al. | |
| 2022/0214829 | A1 | 7/2022 | Bhullar et al. | |
| 2023/0054055 | A1 * | 2/2023 | Milobinski | H05K 7/1487 |
| 2023/0060313 | A1 | 3/2023 | Phan et al. | |
| 2023/0168269 | A1 | 6/2023 | Wright | |
| 2024/0134425 | A1 | 4/2024 | Curtis | |
| 2024/0184732 | A1 * | 6/2024 | Skirmont | G06F 13/385 |
| 2024/0201763 | A1 | 6/2024 | Jun et al. | |

FOREIGN PATENT DOCUMENTS

| | | | |
|---|---|---|---|
| JP | 2013517538 | A | 5/2013 |
| KR | 20150112796 | A | 10/2015 |
| KR | 20200027608 | A | 3/2020 |
| KR | 20210029042 | A | 3/2021 |
| KR | 20230029323 | A | 3/2023 |
| WO | 2009116735 | A2 | 9/2009 |
| WO | 2018165601 | A1 | 9/2018 |
| WO | 2018218168 | A1 | 11/2018 |

OTHER PUBLICATIONS

Author N/A; Keysight Technologies B1505A Power Device Analyzer/Curve Tracer Source: https://www.keysight.com/us/en/assets/7018-02312/technical-overviews/5990-4654.pdf Publication Date: Jul. 21, 2014.

Wang; Concept Product—CP121 Discussions; Source: http://icydockforums.com/t/concept-product-cp121-discussions/1433; Publication Date: Jun. 2022.

Kennedy; E1 and E3 EDSFF to Take Over from M.2 and 2.5 in SSDs ; Source: https://www.servethehome.com/e1-and-e3-edsff-to-take-over-from-m-2-and-2-5-in-ssds-kioxia/2/; Publication Date: Jun. 29, 2021.

Author N/A; ORICO USB-C NVMe M.2 SSD Enclosure Aluminum USB3.1 Gen2 10Gbps PCle SSD Enclosure with Cooling Fan with LED Temperature Display M.2 Drive to Type-C External Storage Case Up to 4TB Grey-M2PX Source: https://www.amazon.ca/ORICO-Enclosure-Aluminum-Temperature-Grey-M2PX/dp/B0895SCHXL Publication Date: NA.

Author N/A; 3.5" HDD Enclosure with LCD display (USB + eSATA) Source: https://usb.brando.com/3-5-hdd-enclosure-with-LCD-display-usb-esata -_ p600c44d15.html Publication Date: NA.

Office Action for Korean Patent Application No. 10-2024-0099357, mailed Mar. 1, 2026, 12 Pages.

Office Action for Korean Patent Application No. 1020240102114, mailed Jul. 16, 2025, 17 Pages.

* cited by examiner

DEVICE COOLING ENCLOSURE AND ADAPTER FOR HOUSING DEVICES OF DIFFERENT WIDTHS

CROSS-REFERENCE TO RELATED APPLICATIONS

This application claims the benefit of and priority to U.S. Provisional Application No. 63/466,621, filed May 15, 2023, to U.S. Provisional Patent Appl. No. 63/443,250 filed Feb. 3, 2023, and to U.S. Provisional Patent Appl. No. 63/531,792 filed Aug. 9, 2023, which are incorporated herein by reference in their entirety.

BACKGROUND

A device or equipment under test (DUT) is typically tested to determine the performance and consistency of the device before the device is sold. For example, a DUT can be tested using a large variety of test cases, and the result of the test cases can be compared to an expected output result. When the result of a test case does not match a satisfactory value or range of values, the device can be considered a failed device or outlier, and the device can be binned based on performance parameters, etc.

A DUT is usually tested by automatic or automated test equipment (ATE), which may be used to conduct complex testing using software and automation to improve the efficiency of testing. The DUT may be any type of semiconductor device, wafer, or component that is intended to be integrated into a final product, such as a computer, network interface, memory, or other hardware component, such as a solid-state drive (SSD). By removing defective or unsatisfactory chips at manufacture using ATE, the quality of the yield can be significantly improved.

Testing often causes DUTs to heat up. Cooling systems are therefore utilized. The cooling systems used in modern test systems are often designed to test DUTs of a certain form factor width, such as DUTs of the E3.S narrow and E3.S wide form factors, which are 7.5 mm and 16.8 mm wide, respectively. Other common form factors include 7 mm and 15 mm wide form factors. Wider form factors are often used for higher-powered devices that generate more heat such as computational storage and high-capacity storage, as these wider form factors allow for better heat dissipation. DUTs of different widths or "thicknesses" in the E3 form factor are also referred to in the industry as 1T (single-width) or 2T (double-width). Examples of other form factors that can be used with embodiments of the present invention for housing and cooling include the U.2 form factor, which provides 7 mm wide and 15 mm wide form factor widths.

With these constraints, it is not presently possible to use wide and narrow form factor width DUTs across a single device interface board (DIB) using existing Independent Thermal Cooling (ITC) systems that include independent controllable cooling channels for cooling different DUTs. For ITC cooling systems, a completely different DIB assembly, new manufacturing tooling, new part numbers, and separate program management are provided and implemented to test and cool these devices, which are costly and time-consuming. Testing these devices also requires the end-user to uninstall high-level assemblies and reinstall different high-level assemblies for different DUT widths. A more flexible approach to cooling DUTs of different widths using the same testing and cooling system is desired.

SUMMARY

Accordingly, what is needed is an approach to device enclosures that is adaptable and can conform to different form factors (e.g., devices of different widths), such as the E3.S 1T ("single-width," 7.5 mm) and E3.S 2T ("double-width," 16.8 mm) form factors mentioned above, to operate, test and/or cool devices of different sizes. In accordance with embodiments of the present invention, a DUT air duct shroud ("DUT shroud") is provided that can receive and house DUTs of a specific form factor (e.g., E3.S 2T), and can also advantageously be selectively adapted to house and cool DUTs of a narrower form factor width (e.g., E3.S 1T). The DUT shrouds described herein guide the DUT into the correct position and orientation to be received by the test system for quick and convenient installation, and advantageously redirect the air flow to the narrower form factor for effective cooling during testing or under normal operation. The DUT shrouds can be used in conjunction with device interface boards (DIBs) and similar components used to test memory devices and computer hardware.

According to one embodiment, an apparatus for housing a device under test (DUT) during testing is disclosed. The apparatus includes a housing or shroud operable to selectively receive one of: a double-width DUT, or a single-width DUT and a DUT adapter. The housing includes upper receiving features and lower receiving features, and the DUT adapter includes an upper member and a lower member. The upper member and the lower member are operable to be received by the upper receiving features and lower receiving features of the housing, respectively, to couple the DUT adapter to the housing. The housing is operable to be received by a device interface board (DIB) of a test system to test either the double-width DUT or the single-width DUT, and to receive cold air from a cooling system of the test system and direct the cold air over surfaces of a DUT housed therein for cooling. The shroud may be used for device testing or to maintain an optimal device temperature during normal operation.

According to some embodiments, the housing is further operable to receive the double-width DUT without using any adapter.

According to some embodiments, the single-width DUT is approximately 7.5 mm wide, and the double-width DUT is approximately 16.8 mm wide.

According to some embodiments, the cooling system includes a plurality of fans and a plurality of cooling channels.

According to some embodiments, the DUT includes a temperature sensor, and the DUT is cooled by the cooling system according to a measurement of the temperature sensor.

According to some embodiments, the housing and the DUT adapter include electrostatic discharge (ESD) materials.

According to some embodiments, the housing and the DUT adapter are 3D printed.

According to a different embodiment, a consumer electronic product for housing and cooling a memory device is disclosed. The product includes a housing including upper receiving features and lower receiving features for securing an adapter to the housing, and a cooling system disposed within the housing and operable to cool a memory device disposed in the housing during normal operations thereof by blowing air towards the memory device. The housing receives air from the cooling system and directs the air over surfaces of the memory device.

According to some embodiments, the housing is operable to selectively receive either a double-width memory device or a single-width memory device and an adapter, the adapter including an upper member and a lower member. The upper member and the lower member are operable to be received by the upper receiving features and lower receiving features of the housing, respectively, to couple the adapter to the housing.

According to some embodiments, the housing is operable to receive the double-width memory device without using an adapter.

According to some embodiments, the cooling system is operable to maintain the memory device within a prescribed temperature range during operation thereof for increased performance of the memory device.

According to some embodiments, the cooling system includes a fan for moving air, control circuits for controlling operation of the fan, and thermostat elements coupled to the control circuit for measuring temperature of the memory device.

According to another embodiment, an apparatus for housing a device under test (DUT) during testing is disclosed. The apparatus includes a housing operable to selectively receive one of: a first form factor DUT, or a second form factor DUT and a DUT adapter. The housing includes upper receiving features and lower receiving features, and the DUT adapter includes an upper member and a lower member. The upper member and the lower member are operable to be received by the upper receiving features and lower receiving features of the housing, respectively, to couple the DUT adapter to the housing, and the housing is operable to be received by a device interface board (DIB) of a test system to test either the first form factor DUT or the second form factor DUT. The housing is operable to receive cold air from a cooling system of the test system and direct the cold air over surfaces of a DUT housed therein for cooling.

According to some embodiments, the housing is further operable to receive the first form factor DUT without using any adapter.

According to some embodiments, the first form factor DUT includes an E3.S 2T DUT, and the second form factor DUT includes an E3.S 1T DUT.

According to some embodiments, the first form factor DUT includes a double-width form factor, and the second form factor DUT includes a single-width form factor.

According to some embodiments, a front side of the housing is sealed to prevent air leaks.

According to some embodiments, the upper member and the lower member are operable to be depressed to insert the DUT adapter into the housing.

According to some embodiments, the upper member and the lower member are operable to be depressed to remove the DUT adapter from the housing.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1A:
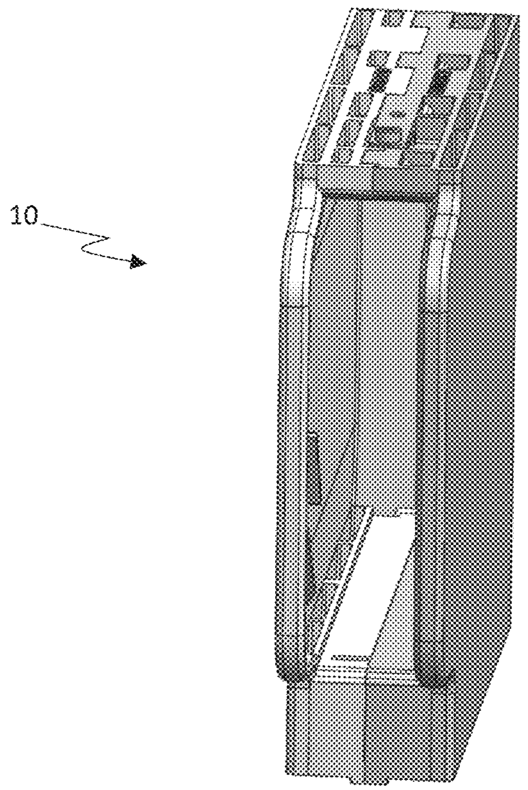
FIG. 1A is a schematic diagram of an exemplary empty DUT cooling shroud for housing and cooling double-width DUTs according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, parameters, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," "labeling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, algorithms, programs, objects, components, data structures, etc. that perform particular tasks or implement particular abstract data types. Typically the functionality of the program modules may be combined or distributed as desired in various embodiments.

DUT Cooling Shroud for Use with DUT Test Systems and Cooling Systems Thereof

Embodiments of the present invention provide a DUT air duct shroud ("DUT shroud" or "cooling shroud") that can receive and house DUTs of a specific form factor width (e.g., E3.S 2T), and can advantageously be selectively adapted to house and cool DUTs of a narrower form factor width (e.g., E3.S 1T). The DUT shrouds described herein guide the DUT into the correct position and orientation to be received by the test system for quick and convenient installation, and advantageously redirect the air flow to the narrower form factor for effective cooling during testing or during normal operation thereof. The DUT shrouds can be used in conjunction with device interface boards (DIBs) and similar components used to test memory devices and computer hardware using active cooling systems. By adapting to DUTs of different form factors, the DUT shroud of the present invention obviates the need for specific DUT shrouds for different DUT form factors.

Figure 1B:
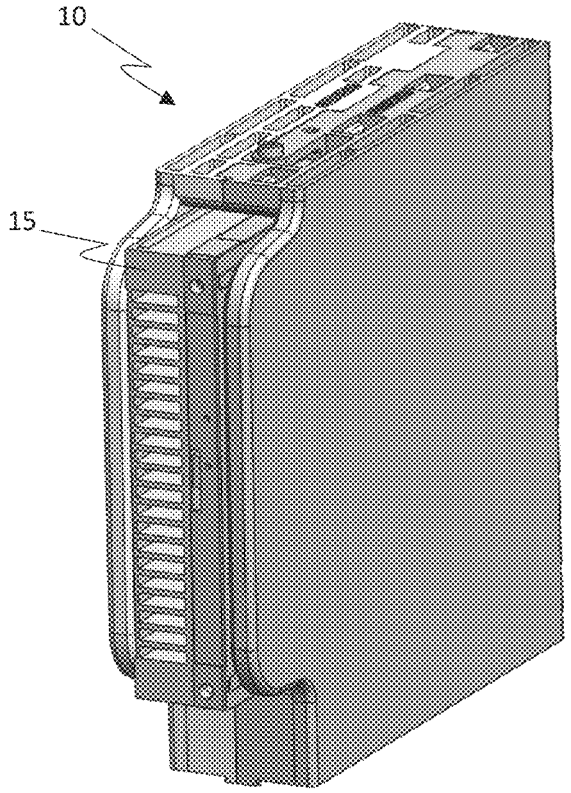
FIG. 1B is a schematic diagram of a DUT cooling shroud housing an exemplary double-width DUT according to embodiments of the present invention.
Figure 1C:
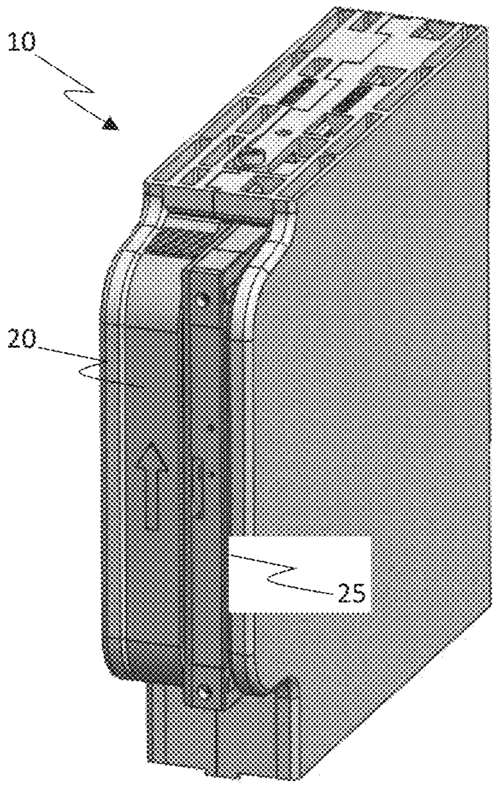
FIG. 1C is a schematic diagram of a DUT cooling shroud and exemplary DUT adapter coupled to single-width DUT for testing using a test system designed for double-width DUTs according to embodiments of the present invention.

FIG. 1A is a schematic diagram of an exemplary empty DUT shroud or enclosure 10 for housing and cooling DUTs according to embodiments of the present invention. DUT shroud or "cooling shroud" 10 can house a double-width DUT, as depicted in FIG. 1B, and can advantageously house a single-width DUT when used with a DUT adapter, as depicted in FIG. 1C. DUT shroud 10 is used in conjunction with a forced air-cooling system that blows cold air over surfaces of a DUT during testing. The front side of DUT shroud 10 is closed/sealed to prevent air from leaking out of the front side, and routes air over surfaces of the DUT for efficient cooling. During DUT testing procedures, the air cools the DUT and exhausts out of the top of DUT shroud 10. The air can be provided to DUT shroud 10 by air ducts, tubes, cooling channels, etc., and can be used in conjunction with temperature sensors to achieve a desired temperature or range of temperatures during testing. The single-width DUT can be 7 or 7.5 mm, and the double-width DUT can be 15 or 16.8 mm wide, for example, according to different form factors.

FIG. 1B is a schematic diagram of DUT shroud 10 housing an exemplary double-width DUT 15 therein according to embodiments of the present invention. The front side of the DUT shroud 10 is closed/sealed to prevent air from leaking out of the front side, and routes air over surfaces of DUT 15 for efficient cooling. The air used to cool DUT 15 exhausts out of the top of the DUT shroud 10.

Figure 1D:
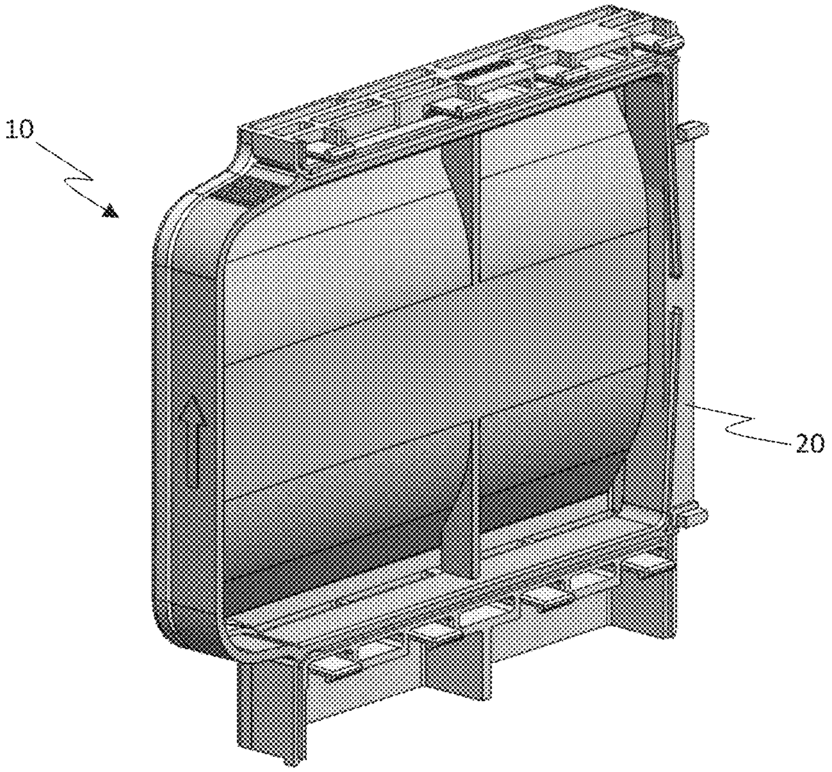
FIG. 1D is a schematic diagram of a DUT adapter coupled to a DUT cooling shroud for receiving a single-width DUT for testing using a test system designed for double-width DUTs according to embodiments of the present invention.

FIG. 1C is a schematic diagram of DUT shroud 10 and exemplary DUT adapter 20 coupled to single-width DUT 25 housed therein for device testing using a test system designed for double-width DUTs according to embodiments of the present invention. FIG. 1D is a schematic diagram of DUT adapter 20 coupled to DUT shroud 10 for receiving a single-width DUT according to embodiments of the present invention. In the example of FIG. 1D, some portions of DUT shroud 10 are not depicted for better visibility of DUT adapter 20.

Figure 1E:
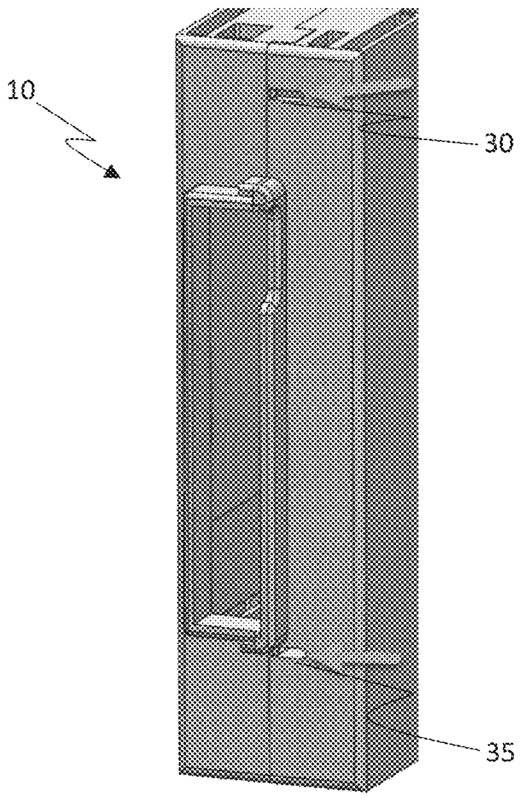
FIG. 1E is a schematic diagram of the back of a DUT cooling shroud including rear receiving features for the DUT adapter and for accepting a single-width DUT to the DUT shroud according to embodiments of the present invention.
Figure 1F:
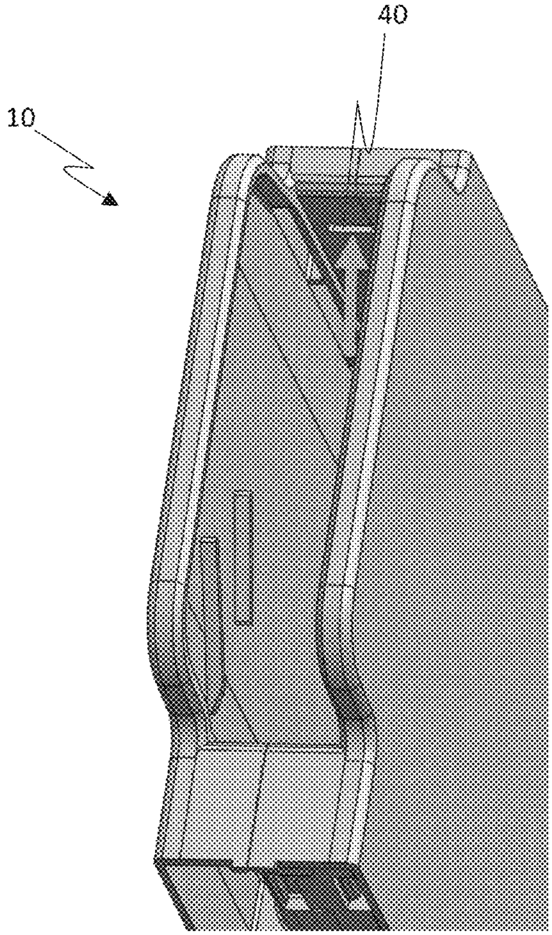
FIG. 1F is a schematic diagram of the front of an empty DUT cooling shroud depicting upper receiving features for securing a single-width DUT to the DUT shroud according to embodiments of the present invention.
Figure 1G:
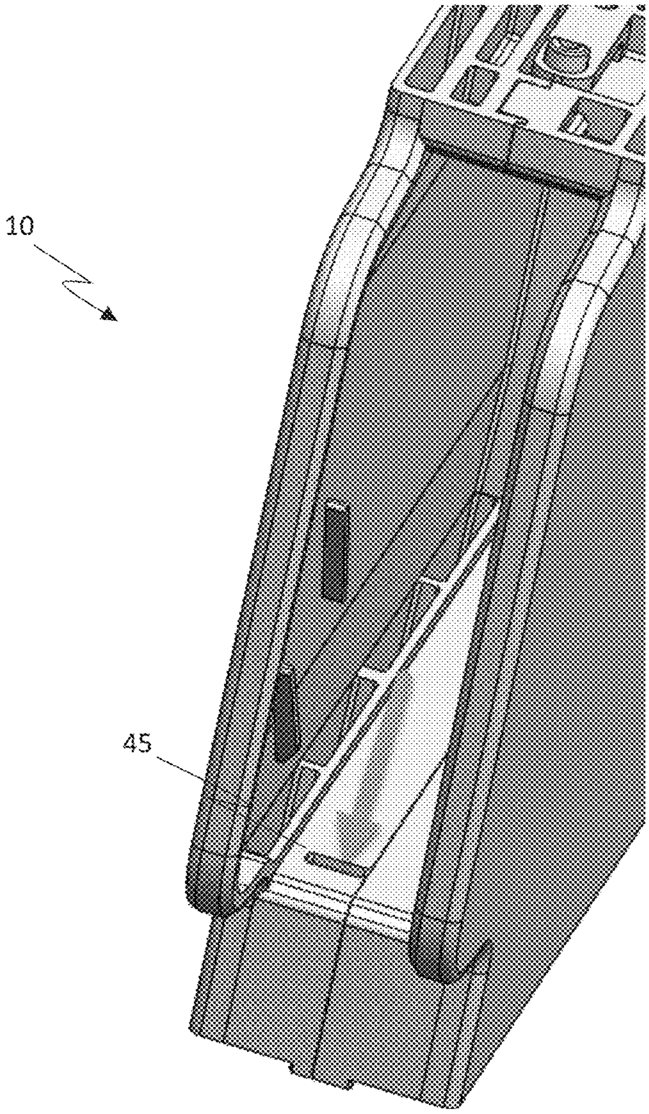
FIG. 1G is a schematic diagram of the front of an empty DUT cooling shroud depicting lower receiving features for securing a single-width DUT to the DUT shroud according to embodiments of the present invention.

FIGS. 1E-1G show exemplary receiving features of DUT shroud 10 used to align, position, and secure a DUT adapter to DUT shroud 10 for testing and cooling a DUT that has a narrower form factor than DUT shroud 10. FIG. 1E is a schematic diagram of the back of DUT shroud 10 including rear receiving features 30 and 35 for securing a single-width DUT adapter to the DUT shroud according to embodiments of the present invention (see FIGS. 2A-2C). FIG. 1F is a schematic diagram of the front of empty DUT shroud 10 depicting upper receiving features 40 for securing a single-width DUT adapter to the DUT shroud according to embodiments of the present invention. FIG. 1G is a schematic diagram of the front of empty DUT shroud 10 depicting lower receiving features 45 for securing a single-width DUT adapter to the DUT shroud according to embodiments of the present invention.

DUT Adapter for Using Single-Width DUT with Double-Width DUT Shroud

Figure 2A:
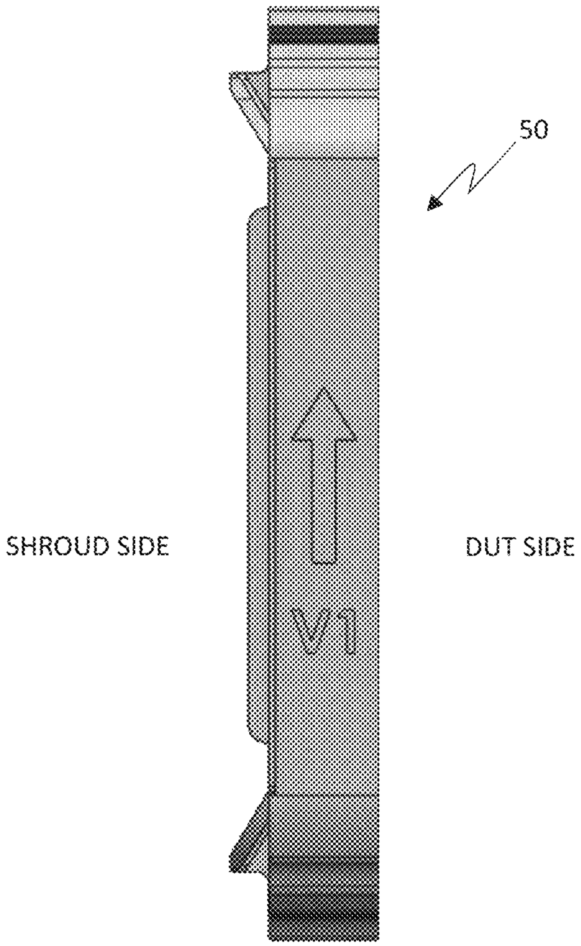
FIG. 2A is a schematic diagram of an exemplary DUT adapter operable to be coupled to a DUT shroud to accommodate DUTs of different widths according to embodiments of the present invention.

FIG. 2A is a schematic diagram of an exemplary DUT adapter 50 operable to be coupled to a DUT shroud to accommodate DUTs of different widths for device testing and cooling according to embodiments of the present invention. In the example of FIG. 2A, the left side of DUT adapter 50 is configured to be disposed against the interior of a DUT shroud, and the right side of DUT adapter 50 is configured to be disposed against a surface of a single-width DUT. When coupled to a single-width DUT, DUT adapter 50 and the single-width DUT can be received by a test system (e.g., a DIB of the test system) that is designed to accommodate and cool double-width DUTs. Advantageously, the DIB does not need to be changed to accommodate the narrower form factor DUT, and the DUT can be cooled efficiently by the existing active cooling system.

Figure 2B:
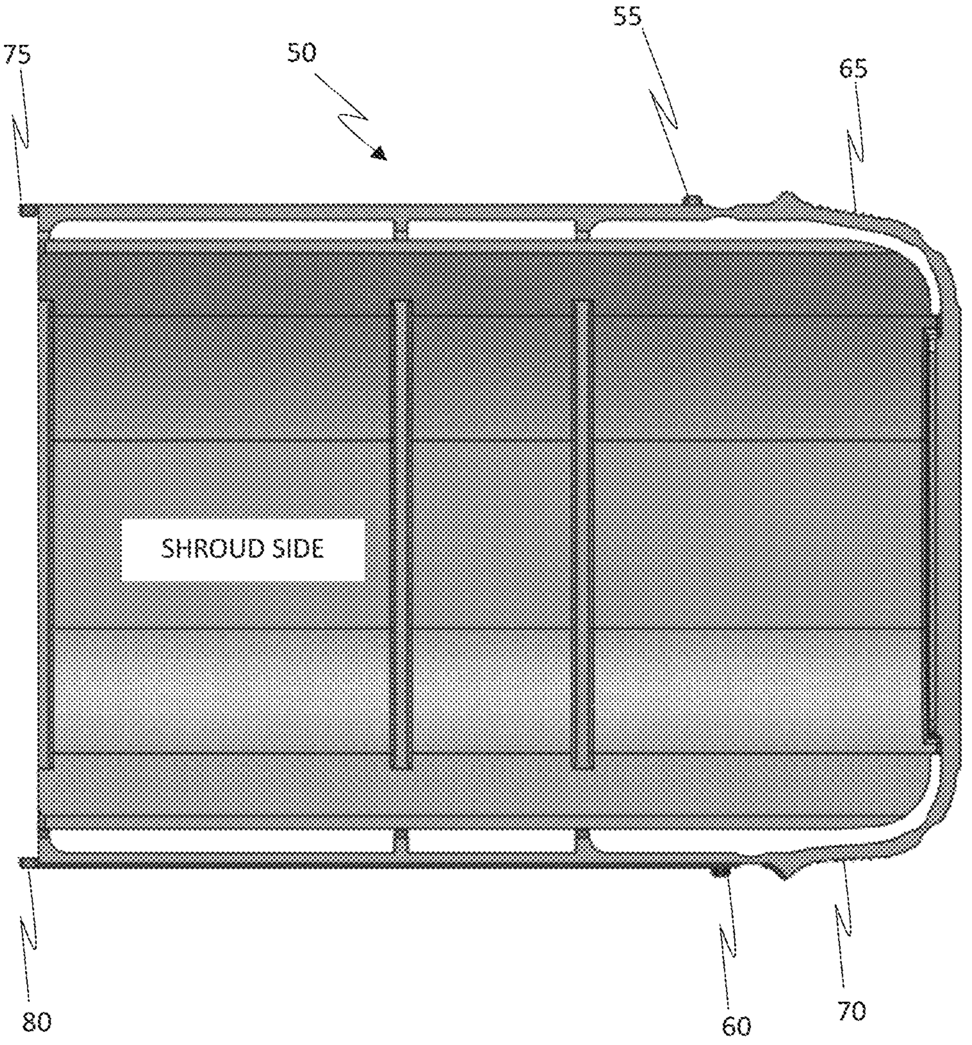
FIG. 2B is a schematic diagram of DUT adapter from a side view according to embodiments of the present invention.

FIG. 2B is a schematic diagram of DUT adapter 50 from a side view according to embodiments of the present invention. DUT adapter 50 includes rear protruding members (e.g., fingers, pegs, etc.) 75 and 80 disposed on the top and bottom of DUT the back of adapter 50, respectively, and top protruding members 55 and 60 disposed on the top and bottom of DUT adapter 50, respectively, near the front of DUT adapter 50. Rear protruding members 75 and 80 are operable to be received by rear receiving features 30 and 35 of DUT shroud 10 depicted in FIGS. 1E-1G to secure adapter 50 to the DUT shroud and to ensure that adapter 50 is positioned and oriented correctly to receive and test a DUT. Top protruding members 55 and 60 are operable to be received by upper and lower receiving features, respectively, such as upper receiving feature 40 depicted in FIG. 1F and lower receiving feature 45 depicted in FIG. 1G.

Figure 2C:
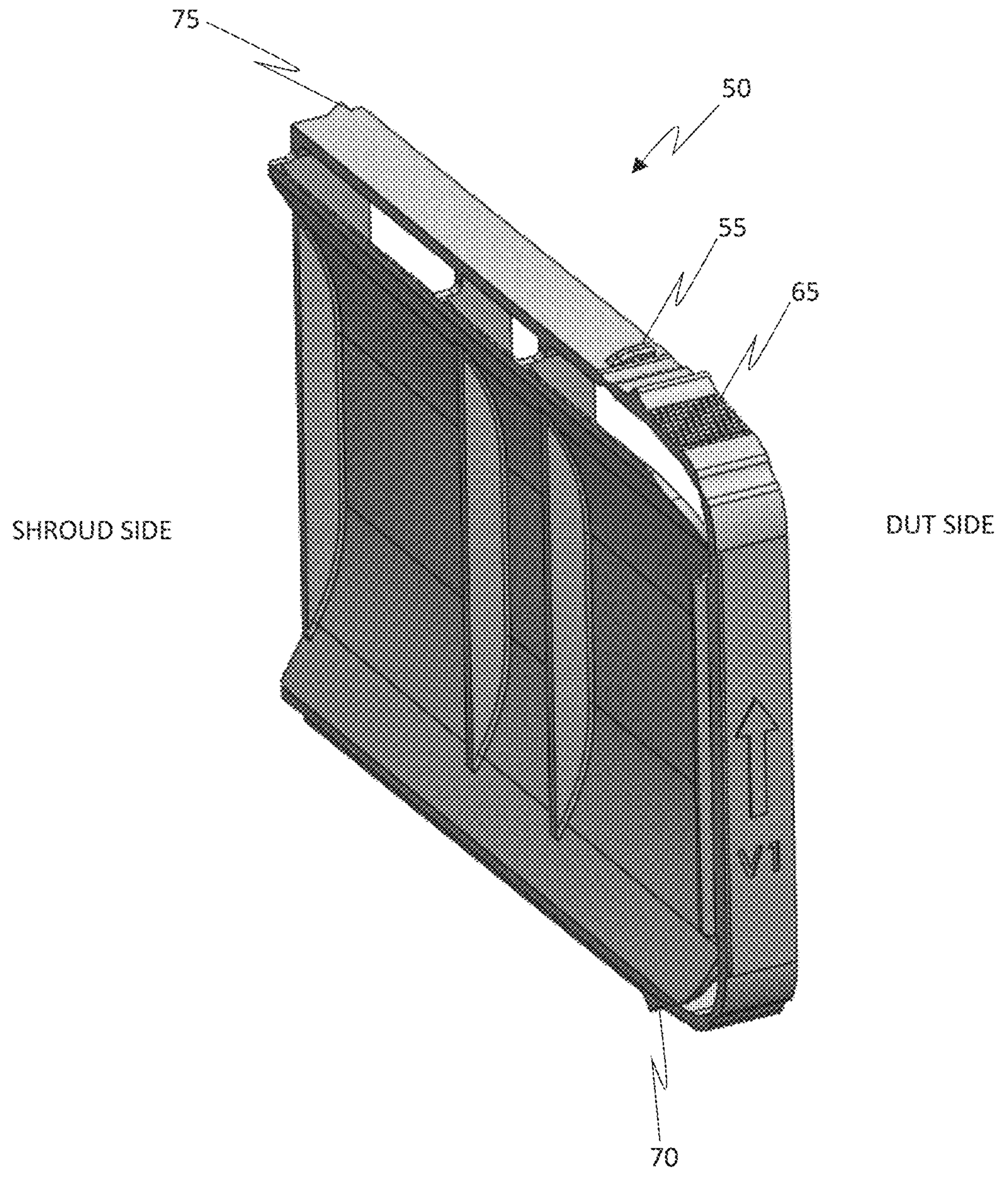
FIG. 2C is a schematic diagram of DUT adapter from an isometric view according to embodiments of the present invention.

Protruding members (e.g., lugs) 55 and 60 can be depressed by pressing or squeezing finger-positioning stops 65 and 70, respectively. Adapter 50 can be inserted into a DUT shroud by squeezing finger-positioning stops 65 and 70 and releasing the finger-positioning stops 65 and 70 once adapter 50 is positioned within the DUT shroud to lock adapter 50 in place via lugs 55 and 60. Similarly, adapter 50 can be removed from a DUT shroud by squeezing finger-positioning stops 65 and 70 and pulling adapter 50 from the DUT shroud. The thin portions of DUT adapter 50 on either side of finger-positioning stops 65 and 70 act as hinges that allow portions of DUT adapter 50 to bend or flex during installation and removal so that lugs 55 and 60 can be received by or released from the corresponding receiving member. FIG. 2C is a schematic diagram of DUT adapter 50 from an isometric view according to embodiments of the present invention. As depicted in FIG. 2C, the surface of finger-positioning stops 65 and 70 can have a rough or ribbed texture to provide better grip when depressing the hinges and lugs 55 and 60 to insert or remove adapter 50 from a DUT shroud.

According to some embodiments, the DUT shroud and DUT adapter can be made from materials produced by a 3D printer, etc. According to some embodiments, the DUT shroud and DUT adapter are made from electrostatic discharge (ESD) materials/plastics that reduce static electricity and the discharge thereof.

Figure 3:
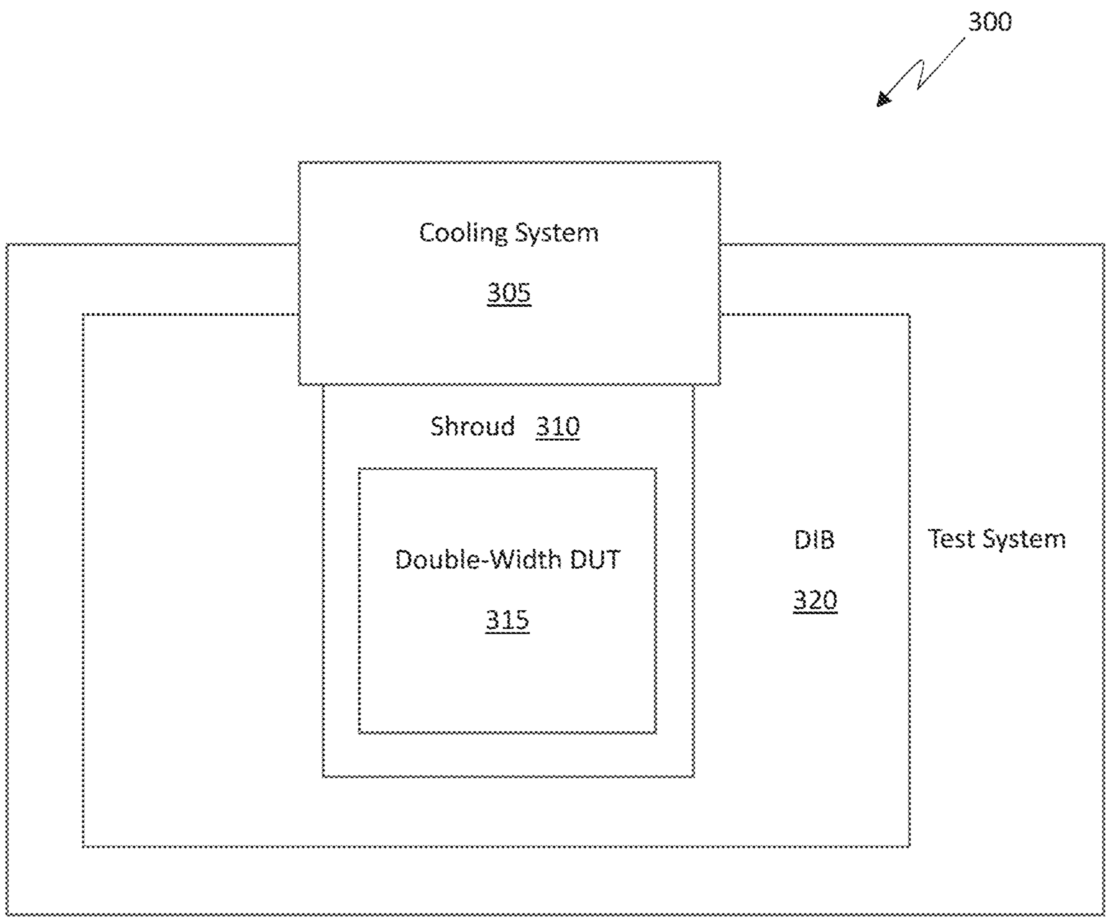
FIG. 3 is a block diagram of an exemplary test system for testing and cooling a double-width DUT using a DUT cooling shroud described herein according to embodiments of the present invention.

FIG. 3 is a block diagram of an exemplary test system 300 for testing and cooling a double-width DUT 315 using a DUT cooling shroud 310 according to embodiments of the present invention. DUT shroud 310 houses and secures double-width DUT 315, and directs cold air over surfaces of DUT 315 to cool the DUT during testing. Although only a single DUT is depicted, multiple DUTs can be coupled to test system 300 and tested concurrently, each DUT being disposed in its own DUT shroud. In the example of FIG. 3, double-width DUT 315 is received by DUT shroud 310, and DUT shroud 310 is received by DIB 320 for testing. DIB 320 transmits data and instructions from test system 300 to DUTs for testing, and a cooling system 305 blows cold air towards the DUTs, for example, using fans that blow air into active cooling channels, ducts, etc., which control and route the air over surface of the DUTs to reach a desired temperature or temperature range.

Figure 4:
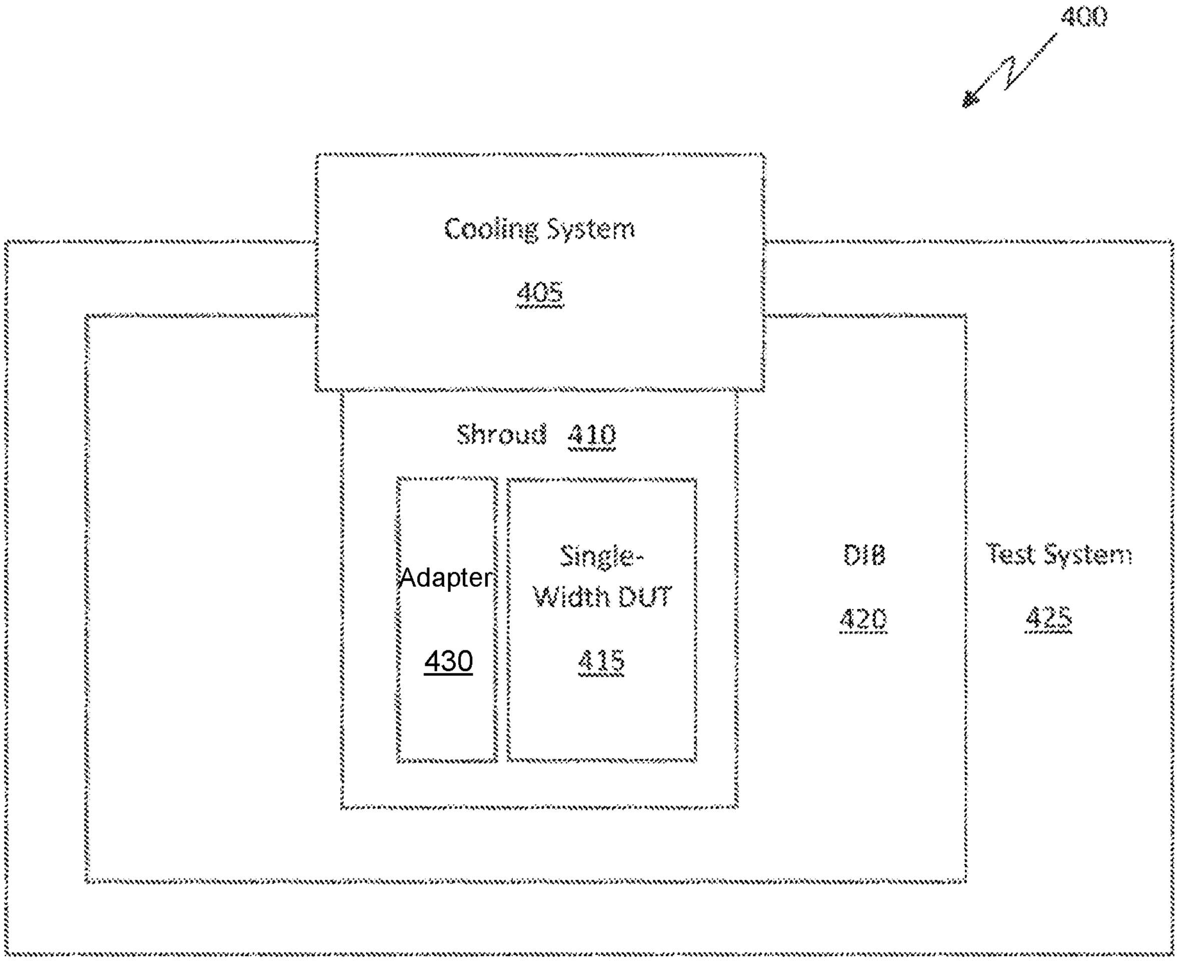
FIG. 4 is a block diagram of an exemplary test system for testing and cooling a single-width DUT using a DUT cooling shroud in combination with a DUT adapter described herein according to embodiments of the present invention.

FIG. 4 is a block diagram of an exemplary test system 400 for testing and cooling a single-width DUT 415 using a DUT shroud 410 according to embodiments of the present invention. DUT shroud 410 houses and secures single-width DUT 415 in conjunction with adapter 430 coupled to single—with DUT 415 using lugs and fingers as depicted above in FIGS. 1E-1G. Shroud 410 directs cold air over surfaces of DUT 415 to cool the DUT during testing performed by test system 425. Although only a single DUT is depicted, multiple DUTs can be coupled to test system 400 and tested concurrently, each DUT being disposed in its own DUT shroud. In the example of FIG. 4, single-width DUT 415 is coupled to adapter 430 and received by DUT shroud 410, and DUT shroud 410 is received by DIB 420 for testing. DIB 420 transmits data and instructions from test system 300 to DUTs for testing, and a cooling system 405 blows cold air towards the DUTs, for example, using fans that blow air into active cooling channels, ducts, etc., which control and route the air over surface of the DUTs to reach a desired temperature or temperature range.

Figure 5:
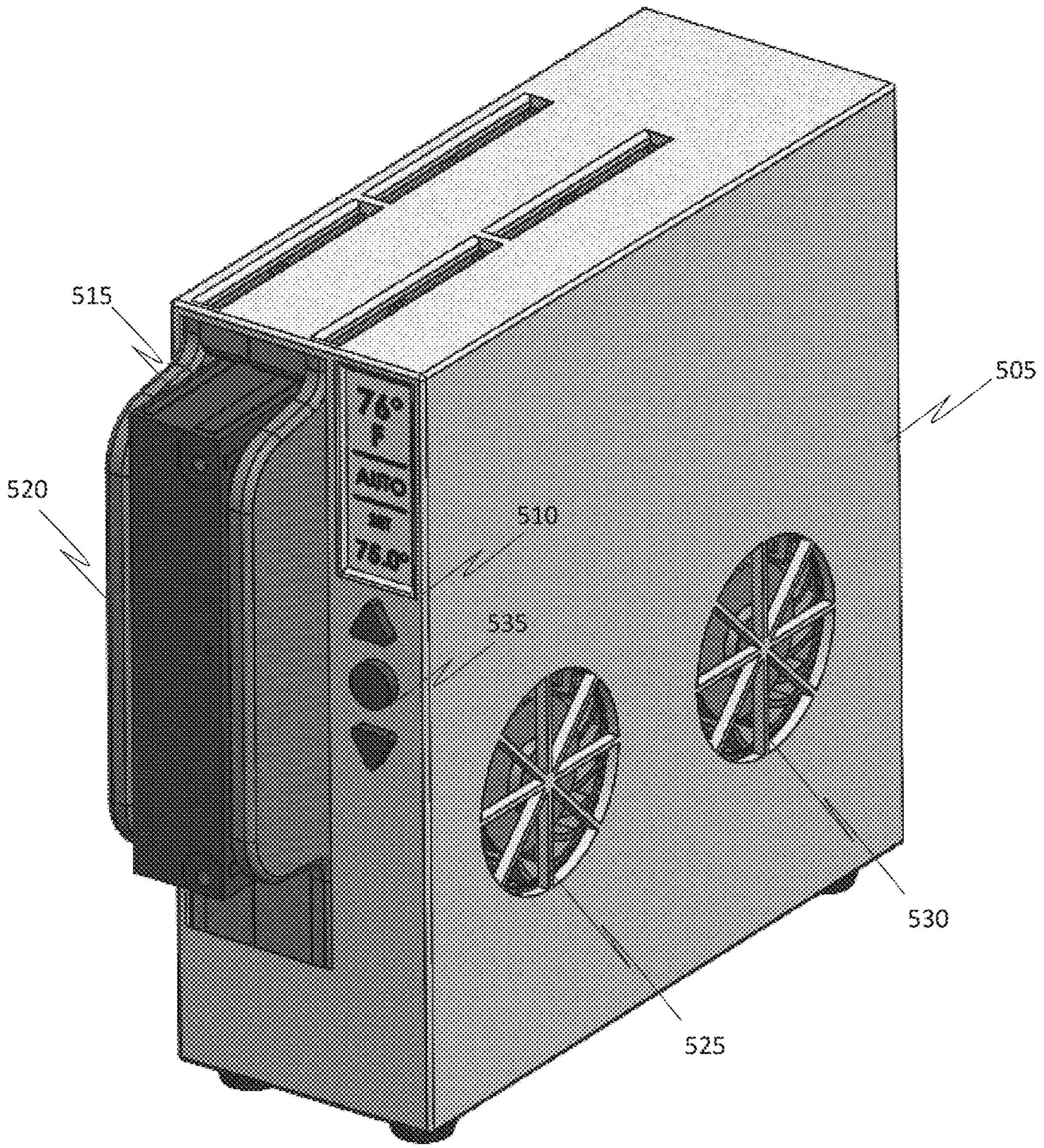
FIG. 5 is a diagram of an exemplary device enclosure and cooling system for operating a memory hardware device according to embodiments of the present invention.

Device Enclosure for Housing and Cooling Consumer Memory/Storage Device During Consumer Use Thereof FIG. 5 depicts an exemplary device enclosure 505 for housing and cooling a consumer memory or other hardware storage device under normal operations thereof according to embodiments of the present invention. Similar to the embodiment depicted in FIG. 1B, enclosure 505 is operable to house a device of a certain form factor (e.g., a double-wide form factor) using a device shroud 520 that secures the device and directs cold air over surfaces thereof. Enclosure 505 can be adapted to house and cool a device of a narrower form factor (e.g., a single-wide form factor) using an adapter according to embodiments. In the example of FIG. 5, enclosure 505 houses a consumer memory device 515, such as a solid-state drive (SSD), using device shroud 520 to secure device 515 in place and cool the device using an active cooling system 510 including fans 525 and 530. The system of FIG. 5 is intended to be used by a consumer of the SSD during normal operation of the SSD to provide system cooling to enhance the performance of the SSD. The example of FIG. 5 shows a double-width device 515 installed in enclosure 505 (without using an adapter).

The cooling system 510 includes control circuits for activating fans 525 and 530 and controlling the speed of fans

525 and 530, and a temperature sensor/thermostat that measures real-time temperatures of the device so that the device can be cooled to a desired temperature or range of temperatures during normal operational use of the SSD. Cooling system 510 can also include a piezoelectric cooling system, compressed dry air, etc., and optionally includes buttons 535 for adjusting the cooling system 510 to a desired temperature, or to change an operating mode of cooling system 510 (e.g., On, Off, Auto, etc.). Performance of the memory device can be optimized by maintaining the temperature thereof within prescribed limits.

The cooing system of FIG. 5 is advantageous because SSDs operate at optimal performance within prescribed temperature levels. The cooling system as shown in FIG. 5 advantageously increases the performance and lifetime of the SSD in its consumer-based operation by maintaining a temperature or range of temperatures during normal operation.

Figure 6:
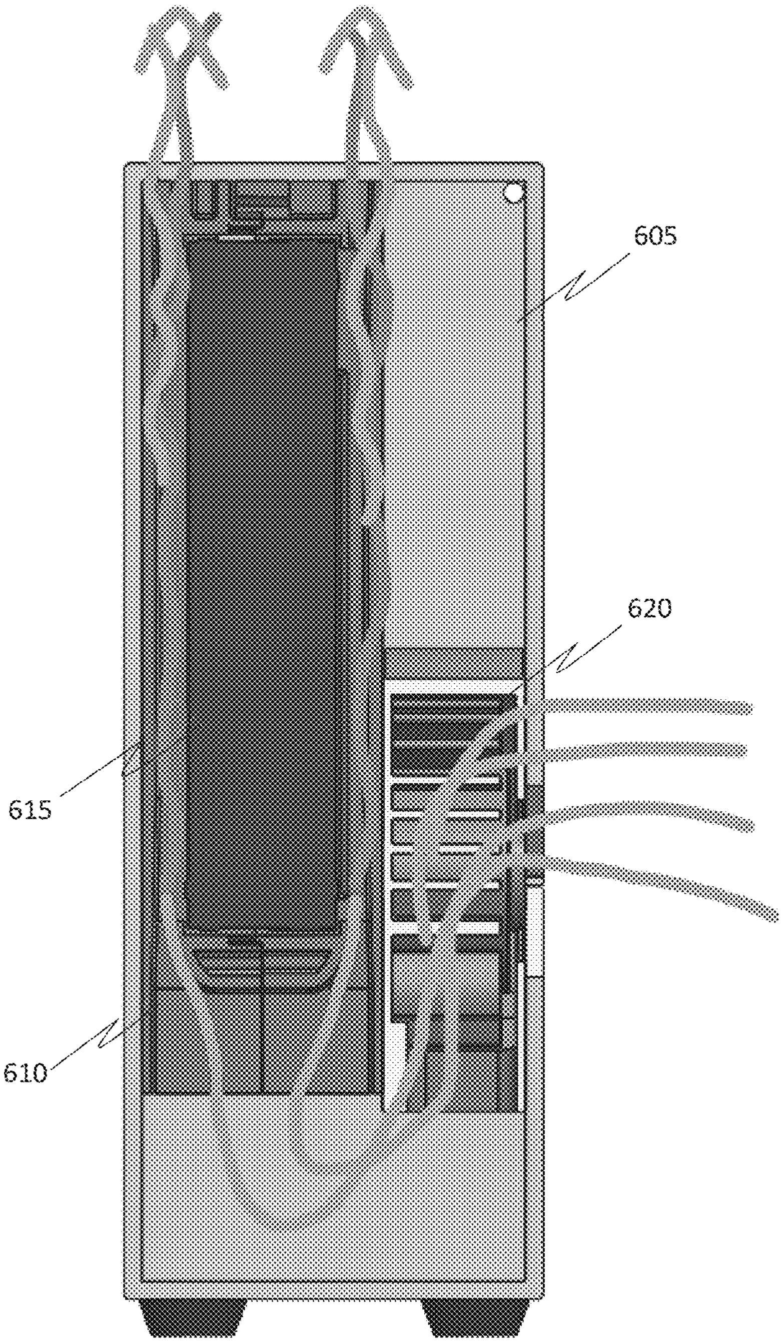
FIG. 6 is a diagram showing exemplary air flow of a device enclosure for housing and cooling a consumer memory or other hardware storage device according to embodiments of the present invention.

FIG. 6 depicts exemplary air flow of an exemplary device enclosure 605 for housing and cooling a consumer memory or other hardware storage device according to embodiments of the present invention. As depicted in the example of FIG. 6, air from outside enclosure 605 is drawn into the enclosure by fans 620, and the air is guided over the surfaces of device 615 by shroud 610, which secures device 615 within enclosure 605. The air cools device 615 during operation and flows out of the top of enclosure 605 to exhaust the air into the environment as new air is drawn into enclosure 605.

Figure 7:
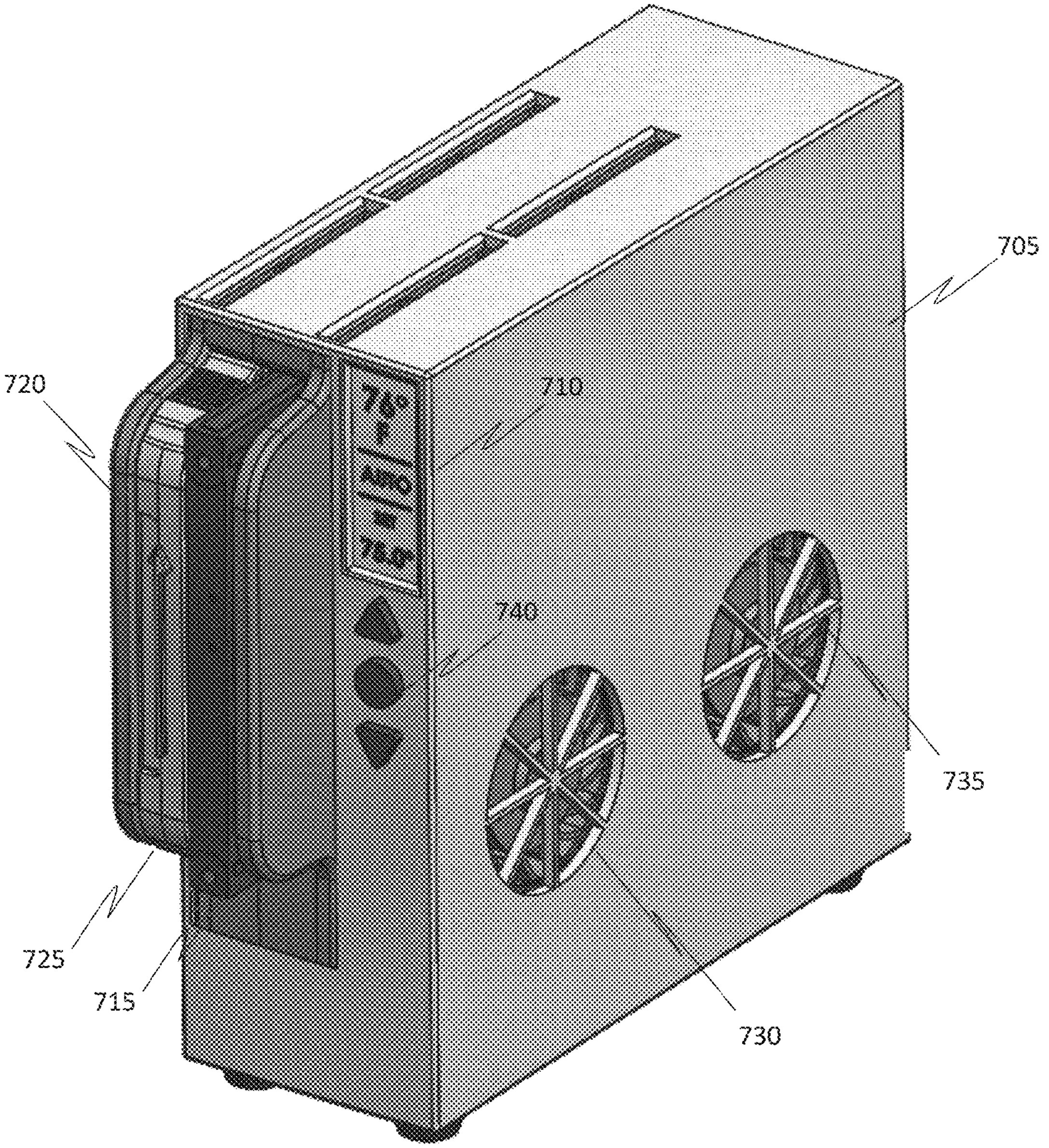
FIG. 7 depicts an exemplary device enclosure for housing and cooling a consumer memory or other hardware storage device using a device adapter according to embodiments of the present invention.

FIG. 7 depicts an exemplary device enclosure 705 for housing and cooling a consumer memory or other hardware storage device using a device adapter according to embodiments of the present invention. Similar to the embodiment depicted in FIG. 1C, enclosure 705 is adapted to house and cool a device of a narrower form factor (e.g., a single-wide form factor) using an adapter 725. In the example of FIG. 7, enclosure 705 houses a consumer memory device 715, such as a solid-state drive (SSD), using device shroud 720 in conjunction with device adapter 725 to secure the device in place and cool the device using an active cooling system 710 including fans 730 and 735. The system of FIG. 7 is intended to be used by a consumer of the SSD during normal operation of the SSD to provide system cooling to enhance the performance of the SSD. The example of FIG. 7 shows a single-width device 715 installed in enclosure 705 using adapter 725.

The cooling system 710 includes control circuits for activating fans 730 and 735 and for controlling the speed of fans 730 and 735, and a temperature sensor/thermostat that measures real-time temperatures of the device so that the device can be cooled to a desired temperature or range of temperatures during normal operational use of the SSD. Cooling system 710 can also include a piezoelectric cooling system, compressed dry air, etc., and optionally includes buttons 740 for adjusting the cooling system 710 to a desired temperature, or to change an operating mode of cooling system 710 (e.g., On, Off, Auto, etc.).

The cooling system of FIG. 7 is advantageous because SSDs operate at optimal performance within prescribed temperature levels. The cooling system as shown in FIG. 7 advantageously increases the performance and lifetime of the SSD in its consumer-based operation by providing an effective temperature maintenance apparatus.

Figure 8:
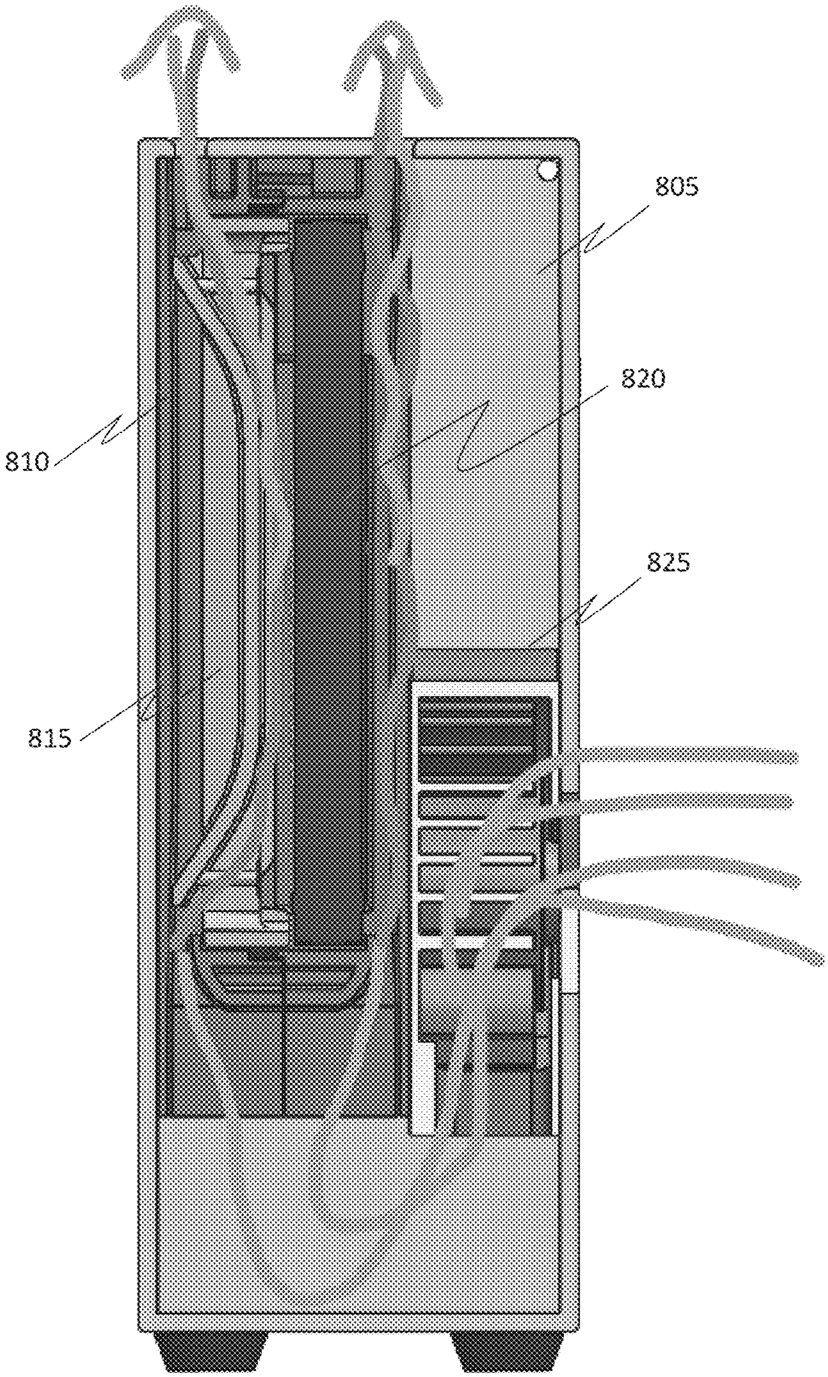
FIG. 8 is a diagram depicting air flow of an exemplary device enclosure for housing and cooling a consumer memory or other hardware storage device according to embodiments of the present invention.

FIG. 8 depicts exemplary air flow of a device enclosure 805 for housing and cooling a consumer memory or other hardware storage device according to embodiments of the present invention. As depicted in the example of FIG. 8, air from outside enclosure 805 is drawn into the enclosure by fans 825, and the air is guided over the surfaces of device 820 by shroud 810 in conjunction with adapter 815, which is secured to shroud 810. The air cools device 820 during operation and flows out of the top of enclosure 805 to exhaust the air into the environment as new air is drawn into enclosure 805.

Figure 9:
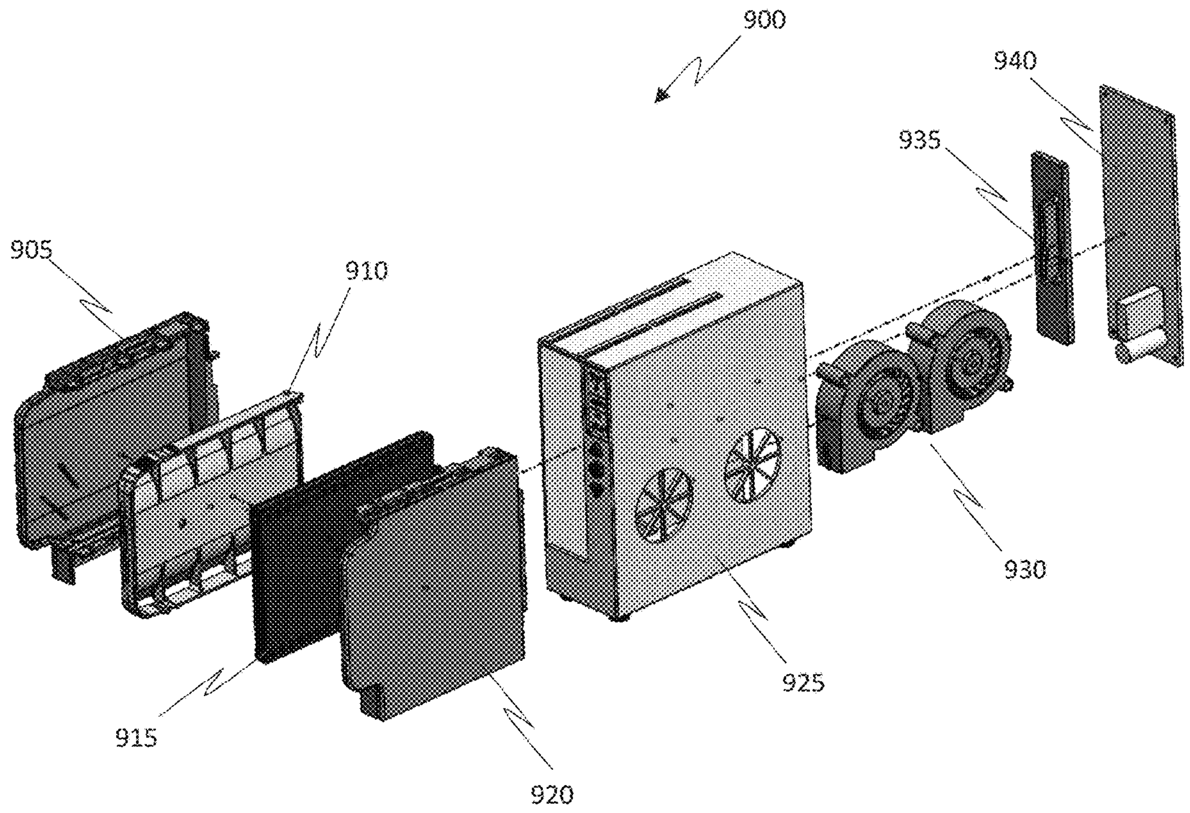
FIG. 9 depicts individual components of an exemplary device enclosure and device adapter for housing and cooling a consumer memory or other hardware storage device according to embodiments of the present invention.

FIG. 9 depicts individual components of an exemplary device enclosure 900 and device adapter 910 for housing and cooling a consumer memory or other hardware storage device according to embodiments of the present invention. Enclosure housing 925 houses a consumer memory device 915, such as a solid-state drive (SSD), and cools the device using an active cooling system including fans 930. Enclosure housing 925 is operable to receive back panel 940 to substantially enclose housing 925 once the components disposed inside the enclosure housing 925 are in place. A device shroud for securing the device in place is depicted in two separate components, a left shroud component 905 and a right shroud component 920, which can be connected to enclose device 915 within device housing 925, and can guide air over the surfaces of device 915 to cool device 915 during operation. A device adapter 910 can be secured to the device shroud for use with a narrow form factor width device. The device shroud can also be used to secure a wide form factor width within housing 925 without using adapter 910.

The system of FIG. 9 is intended to be used by a consumer of device 915 during normal operation of device to provide system cooling to enhance the performance of the device. Control board 935 interfaces with device 915 to receive commands and data from a computer system in communication with device 915 to store and/or retrieve data, for example.

In sum, the disclosed techniques overcome the limitations of traditional methods by providing a flexible and adaptable device enclosure that can accommodate different form factors having different widths for quick and convenient installation, and advantageously redirect the air flow to the narrower form factor for effective cooling during testing or under normal operation. The DUT shrouds can be used in conjunction with device interface boards (DIBs) and similar components used to test memory devices and computer hardware.

At least one technical advantage of the disclosed techniques is that cold air can be received by the shrouds from a cooling system, and the shrouds can direct the cold air over surfaces of a DUT housed therein, which improves cooling performance and reliability. Furthermore, the shrouds can be produced by a 3D printer which reduces costs and improves accessibility.

1. In some embodiments, an apparatus for housing a device under test (DUT) during testing comprises a housing operable to selectively receive a DUT comprising one of a double-width DUT, or a single-width DUT and a DUT adapter, and wherein the housing comprises upper receiving features and lower receiving features, and the DUT adapter comprising an upper member and a lower member, wherein the upper member and the lower member are operable to be received by the upper receiving features and lower receiving features of the housing, respectively, to secure the DUT adapter to the housing, wherein the housing is operable to be received by a device interface board (DIB) of a test system to test either the double-width DUT or the single-width DUT, and wherein the housing is operable to receive cold air from a cooling system of the test system and direct the cold air over surfaces of a DUT housed therein for cooling.

2. The apparatus of clause 1, wherein the housing is further operable to receive the double-width DUT without use of an adapter.

3. The apparatus of clauses 1 or 2, wherein the single-width DUT is approximately 7.5 mm wide, and wherein the double-width DUT is approximately 16.8 mm wide.

4. The apparatus of clauses 1-3, wherein the cooling system comprises a plurality of fans and a plurality of cooling channels.

5. The apparatus of clauses 1-4, wherein the DUT comprises a temperature sensor, and wherein the DUT is operable to be cooled by the cooling system according to a measurement of the temperature sensor.

6. The apparatus of clauses 1-5, wherein the housing and the DUT adapter comprise electrostatic discharge (ESD) materials.

7. The apparatus of clauses 1-6, wherein the housing and the DUT adapter are 3D printed.

8. The apparatus of clauses 1-7, wherein the DUT comprises a solid state drive (SSD).

9. In some embodiments, a consumer electronic product for housing and cooling a memory device comprises a housing comprising upper receiving features and lower receiving features for securing an adapter to the housing, and a cooling system disposed within the housing and operable to cool a memory device operable to be disposed in the housing during normal operations thereof by blowing air towards the memory device, and wherein the housing is operable to receive air from the cooling system and to direct the air over surfaces of the memory device.

10. The consumer electronic product for housing and cooling a memory device of clause 9, wherein the housing is operable to selectively receive either a double-width memory device or a single-width memory device and also receive an adapter, the adapter comprising an upper member and a lower member, wherein the upper member and the lower member are operable to be received by the upper receiving features and the lower receiving features of the housing, respectively, to couple the adapter to the housing.

11. The consumer electronic product for housing and cooling a memory device of clauses 9 or 10, wherein the housing is operable to receive the double-width memory device without using an adapter.

12. The consumer electronic product for housing and cooling a memory device of any of clauses 9-11, wherein the cooling system is operable to maintain the memory device within a prescribed temperature range during operation thereof for increased performance of the memory device.

13. The consumer electronic product for housing and cooling a memory device of any of clauses 9-12, wherein the cooling system comprises a) a fan for moving air, b) control circuits for controlling operation of the fan, and c) thermostat elements coupled to the control circuits for measuring temperature of the memory device.

14. In some embodiments, an apparatus for housing a device under test (DUT) during testing comprises a housing operable to selectively receive a DUT comprising one of a first form factor DUT, or a second form factor DUT and a DUT adapter, and wherein the housing comprising upper receiving features and lower receiving features, and the DUT adapter comprising an upper member and a lower member, wherein the upper member and the lower member are operable to be received by the upper receiving features and lower receiving features of the housing, respectively, to secure the DUT adapter to the housing, wherein the housing is operable to be received by a device interface board (DIB) of a test system to test either the first form factor DUT or the second form factor DUT, and wherein the housing is operable to receive cold air from a cooling system of the test system and direct the cold air over surfaces of a DUT housed therein for cooling.

15. The apparatus of clause 14, wherein the housing is further operable to receive the first form factor DUT without using any adapter.

16. The apparatus of clause 14 or 15, wherein the first form factor DUT comprises an E3.S 2T DUT, and wherein the second form factor DUT comprises an E3.S 1T DUT.

17. The apparatus of clauses 14-16, wherein the first form factor DUT comprises a double-width form factor, wherein the second form factor DUT comprises a single-width form factor width.

18. The apparatus of clauses 14-17, wherein a front side of the housing is sealed to prevent air leaks.

19. The apparatus of clauses 14-18, wherein the upper member and the lower member are operable to be depressed to insert the DUT adapter into the housing.

20. The apparatus of clauses 14-19, wherein the upper member and the lower member are operable to be depressed to remove the DUT adapter from the housing.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Embodiments of the present invention are thus described. While the present invention has been described in particular embodiments, it should be appreciated that the present invention should not be construed as limited by such embodiments, but rather construed according to the following claims.

What is claimed is:

1. An apparatus for housing a device under test (DUT) during testing, the apparatus comprising:

a single housing operable to receive a double-width DUT and operable to receive a single-width DUT and a DUT adapter, and wherein the single housing comprises upper receiving features and lower receiving features; and the DUT adapter comprising an upper member and a lower member, wherein the upper member and the lower member are operable to be received by the upper receiving features and the lower receiving features of the housing, respectively, to secure the DUT adapter to the single housing, the DUT adapter operable to be disposed within the single housing and against a surface of the single-width DUT to accommodate the single-width DUT within the single housing, wherein the single housing is operable to be received by a device interface board (DIB) of a test system to test either the double-width DUT or the single-width DUT, and wherein the single housing is operable to receive cold air from a cooling system of the test system and direct the cold air over surfaces of a DUT housed therein for cooling.

2. The apparatus of claim 1, wherein the single housing is further operable to receive the double-width DUT without use of an adapter.

3. The apparatus of claim 2, wherein the single-width DUT is approximately 7.5 mm wide, and wherein the double-width DUT is approximately 16.8 mm wide.

4. The apparatus of claim 1, wherein the cooling system comprises a plurality of fans and a plurality of cooling channels.

5. The apparatus of claim 4, wherein the DUT comprises a temperature sensor, and wherein the DUT is operable to be cooled by the cooling system according to a measurement of the temperature sensor.

6. The apparatus of claim 1, wherein the single housing and the DUT adapter comprise electrostatic discharge (ESD) materials.

7. The apparatus of claim 1, wherein the single housing and the DUT adapter are 3D printed.

8. The apparatus of claim 1, wherein the DUT comprises a solid state drive (SSD).

9. An apparatus for housing a device under test (DUT) during testing, the apparatus comprising:

a single housing operable to receive a first form factor DUT and operable to receive a second form factor DUT and a DUT adapter, and wherein the single housing comprises upper receiving features and lower receiving features; and the DUT adapter comprising an upper member and a lower member, wherein the upper member and the lower member are operable to be received by the upper receiving features and the lower receiving features of the single housing, respectively, to secure the DUT adapter to the single housing, the DUT adapter operable to be disposed within the single housing and against a surface of the second form factor DUT to accommodate the second form factor DUT within the single housing, wherein the single housing is operable to be received by a device interface board (DIB) of a test system to test either the first form factor DUT or the second form factor DUT, and wherein the single housing is operable to receive cold air from a cooling system of the test system and direct the cold air over surfaces of a DUT housed therein for cooling.

10. The apparatus of claim 9, wherein the single housing is further operable to receive the first form factor DUT without using any adapter.

11. The apparatus of claim 9, wherein the first form factor DUT comprises an E3.S 2T DUT, and wherein the second form factor DUT comprises an E3.S 1T DUT.

12. The apparatus of claim 9, wherein the first form factor DUT comprises a double-width form factor, and wherein the second form factor DUT comprises a single-width form factor.

13. The apparatus of claim 9, wherein a front side of the single housing is sealed to prevent air leaks.

14. The apparatus of claim 9, wherein the upper member and the lower member are operable to be depressed to insert the DUT adapter into the single housing.

15. The apparatus of claim 9, wherein the upper member and the lower member are operable to be depressed to remove the DUT adapter from the single housing.

* * * * *